United States Patent [19]

Guckel

[11] Patent Number: 4,658,279

[45] Date of Patent: Apr. 14, 1987

[54] VELOCITY SATURATED STRAIN SENSITIVE SEMICONDUCTOR DEVICES

[75] Inventor: Henry Guckel, Madison, Wis.

[73] Assignee: Wisconsin Alumini Research Foundation, Madison, Wis.

[21] Appl. No.: 530,401

[22] Filed: Sep. 8, 1983

[51] Int. Cl.[4] ........................ H01L 29/84; H01L 29/78
[52] U.S. Cl. .......................................... 357/26; 357/25; 357/23.7; 357/4; 338/2; 73/777
[58] Field of Search ...................... 357/25, 26, 23.7, 4; 338/2; 73/777

[56] References Cited

U.S. PATENT DOCUMENTS

| | | | |
|---|---|---|---|
| 3,492,861 | 2/1970 | Jund | 357/26 |
| 3,614,678 | 10/1971 | Engeler et al. | 357/26 |
| 3,758,830 | 9/1973 | Jackson | 357/26 |
| 4,025,942 | 5/1977 | Kurtz | 357/26 |
| 4,053,916 | 10/1977 | Cricchi et al. | 357/23.7 |
| 4,065,971 | 1/1978 | Shimazoe | 357/26 |
| 4,191,057 | 3/1980 | Busta | 357/26 |

FOREIGN PATENT DOCUMENTS

| | | | |
|---|---|---|---|
| 994005 | 7/1976 | Canada | 357/26 |
| 0164582 | 12/1981 | Japan | 357/26 |
| 1399988 | 7/1975 | United Kingdom | 357/26 |

OTHER PUBLICATIONS

Sze *Physics of Semiconductor Devices* J. Wiley & Sons, N.Y. 2nd ed. 1981, pp. 314–347, 492–495.

Singh, Proceed. 27th Int. Instr. Symp. Ind. in USA, Apr. 27–30, 1981, Advances in Test Measurement, vol. 18, Instrumentation in the Aerospace Industry, vol. 27.

L. I. Baranov, et al., "Screening of Electric Field in Quasiunipolar Semiconductor," Sov. Phys. Semicond., vol. 10, No. 10, pp. 1164–1166, Oct., 1976.

S. P. Ashmontas, et al., "Influence of the Internal Field of an n–n+Junction on its Electrical Properties," Sov. Phys. Semicond., vol. 12, No. 8, pp. 905–909, Aug., 1978.

A. G. Sabnis, "A Simple Static Circuit Model for Low-High Junctions," Solid-State Electronics, vol. 22, pp. 667–669, 1979.

*Primary Examiner*—Martin H. Edlow
*Assistant Examiner*—Jerome Jackson, Jr.
*Attorney, Agent, or Firm*—Isaksen, Lathrop, Esch, Hart & Clark

[57] ABSTRACT

Velocity saturated strain sensitive devices (13 and 14) can be formed of a layer of silicon on an insulating substrate (11) having a silicon conducting channel of a selected size and proper doping levels to allow carrier velocity saturation to occur therein at reasonable potentials applied across the conducting channel region (21, 24). When operated in velocity saturation or near thereto, a strain imposed on the device, corresponding to deformation of the substrate on which the device is formed, results in large changes in the voltage-current characteristics of the device. The large voltage-current changes occuring with strain effectively provide very high, non-linear gauge factors. Devices can be formed on an insulating substrate, such as sapphire, or can be prepared by diffusing an impurity of one conductivity type into a silicon substrate of the opposite conductivity type to form an isolated channel.

28 Claims, 11 Drawing Figures

VELOCITY SATURATED STRAIN SENSITIVE SEMICONDUCTOR DEVICES

TECHNICAL FIELD

This invention pertains generally to the field of semiconductor devices capable of sensing mechanical strain.

BACKGROUND ART

A strain sensitive electrical device mounted on a substrate will undergo deformation with the substrate, and the strain measured by the device can thereby provide a measure of the deformation in the substrate itself. Such strain sensitive devices can be incorporated in pressure sensors—for example, with the strain sensitive device directly mounted on a pressure sensitive diaphragm or membrane—, and in other dynamic devices such as accelerometers, as well as being used for the direct measurement of static strain in a structural member.

A common manner of measuring the strain in a mechanical member—and therefore its relative deformation—is to form a piezoresistive conductor on the substrate member which is then biased at a desired voltage or current level. A deformation of the substrate causes a strain field in the piezoresistive conductor which changes its resistance, resulting in a variation in the voltage across or the current through the conductor which can be related to the strain imposed upon it. Various common semiconductors are among the materials that exhibit piezoresistivity. A uniformly doped piezoresistive semiconductor, at moderate biasing potentials, will behave as a linear resistor which obeys Ohm's law. The imposition of strain on the semiconductive resistor will change the value of its resistance with a resulting measurable change in voltage across the resistor (if constant current is applied) or change in current through the resistor (if constant voltage is applied). The changes in the resistance of such piezoresistive semiconductors are generally considered to be due to changes in the geometry of the resistor (for example, for a simple rectangle bar resistor, a change in the ratio of area to length will change its resistance), and changes in the active carrier concentration and in the low field carrier mobility.

An important measure of the sensitivity of a strain measuring device is its gauge factor, which, for small signals, can be defined as the ratio of the change in resistance due to strain over the normal (unstrained) resistance divided by the magnitude of the strain that caused the change in resistance. For a piezoresistive semiconductor operated in its linear range, the gauge factor is not a function of the applied voltage or current because the resistance of the semiconductor does not change with the applied voltage or current. A large gauge factor is preferred since the lower the gauge factor the higher the amplification required to provide a usable output signal to processing circuitry, which increases the noise content of the output signal as well as increasing the complexity and cost of the signal conditioning circuitry.

SUMMARY OF THE INVENTION

A strain sensitive silicon semiconductor device in accordance with the present invention is constructed for stable operation under conditions of carrier velocity saturation. When operated in velocity saturation or near thereto, a strain imposed on the device, corresponding to deformation of the substrate on which the device is formed, results in large changes in the voltage-current characteristics of the device. The large voltage-current changes occuring with strain effectively provide very high—though nonlinear—gauge factors which provide greater sensitivity to strain and a significantly higher signal to noise ratio than obtainable in present piezoresistive devices. Consequently, simpler and less expensive signal conditioning circuitry is required for operation on the output signal from the sensor to provide a usable, low noise output signal which is indicative of the strain in the device.

The device is formed as a conducting path in silicon, doped to either N or P type conductivity, and electrically isolated from the adjacent or surrounding substrate material. The conducting path generally includes terminal regions of impurity doped silicon, to which external electrical contacts may be made, and a conducting channel of doped silicon extending between the terminal regions and of the same conductivity type as the terminal regions. The cross-sectional area and the length of the channel are selected such that sufficient electric field intensities will be applied across the channel to cause current saturation at convenient terminal voltages (e.g. between 10 and 30 volts). The channel is doped at selected intermediate impurity concentration levels which allow velocity saturation to take place at the applied voltages. Generally, the preferred impurity doping levels will be in the range of $10^{17}$ to $10^{19}$ per cubic centimeter.

The silicon conducting path may be formed on an insulating substrate, e.g., sapphire, or in a silicon substrate of opposite conductivity type doping, so that conduction takes place substantially exclusively through the channel adapted for velocity saturation. Where the device is formed on a silicon substrate, the device may form an MOS type field effect transistor, with the terminal regions corresponding to an FET source and drain and the channel region corresponding to the FET channel. A metal gate electrode may appropriately be formed on an oxide region overlaying the channel region to allow control of the current through the channel, while sufficient voltage is applied to the source and drain regions to maintain the channel region in velocity saturation.

The strain sensitivity of devices formed in accordance with the invention is significantly larger than that observed with conventional piezoresistive devices, exhibiting effective gauge factors several times the gauge factors normally noted with conventional devices.

Further objects, features and advantages of the invention will be apparent from the following detailed description taken in conjunction with the accompanying drawings.

BEST MODE FOR CARRYING OUT THE INVENTION

Figure 1:
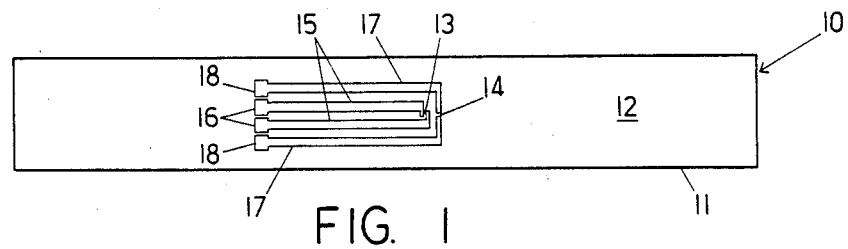
FIG. 1 is a plan view of a cantilever beam formed of silicon on sapphire showing the layout of transversely and longitudinally aligned strain sensitive devices and the metalized contacts made to them.

Carrier mobility in silicon is substantially constant at normal temperatures up to fields of a few thousand volts per centimeter. At higher fields, the carrier mobility declines and carrier velocity tends toward a constant velocity, generally in the range of $10^6$ to $10^7$ cm/sec at room temperature. The consequence of velocity saturation in silicon devices capable of having sufficient voltages applied to them to cause velocity saturation is terminal current which is essentially independent of the applied terminal voltage.

Selection of proper doping levels in the silicon conductor is essential to achieving the desired velocity saturation condition in the devices formed in accordance with the present invention. Doping levels which are too low, particularly when associated with long carrier lifetimes, result in devices in which minority and majority carrier transport occurs and in which diffusion currents or injection effects interfere with the desired velocity saturation characteristic. If the impurity density is too large, large electric fields are necessary to induce constant current behavior; impact ionization can occur, at which point the device breaks down and becomes a constant voltage rather than constant current device. The desired velocity saturation characteristic is therefore restricted to a range of doping levels which enhances constant current operation of the device.

In accordance with the present invention, it has been found that silicon devices operated in a state in or near velocity saturation show a marked increase in their sensitivity to strain as manifested in changes in the voltage-current characteristics at the output terminals of the device. The strain sensitivity that is observed in velocity saturated devices is much greater than that explained by normal piezoresistive effects.

The increased strain sensitivity of the present velocity saturated devices may be illustrated with respect to a very simple silicon resistor formed on a dielectric substrate which is uniformly doped. Because such a device is uniform and isolated, diffusion currents are avoided and constant device cross-section (area A) is maintained.

When a silicon semiconductor, of a length L, mounted on a substrate in the form of a cantilever beam, is subjected to strain (such as by bending the beam), the value of the resistance of the resistor is known to change due to piezoresistive phenomena. Changes in three parameters, the ratio of area to length (A/L), the carrier mobility, and the donor or acceptor concentration can be responsible for the change in resistance. Changes in the carrier mobility and active donor or acceptor density are primarily responsible for the usual piezoresistive effects, and have different magnitudes depending on the alignment of the resistor with respect to the silicon crystal directions. Resistors exploiting these effects in silicon are presently in use in various force or pressure transducers.

If the simple resistor described above is reduced in size so that the device cross-section and length are in the micron range, velocity saturation in the resistor can be obtained at reasonable voltage levels without device breakdown. When a strain is applied to such a device mounted on a cantilevered substrate, the changes in resistance due to geometric variations (A/L changes) occur and are identical with the changes observed in a normal linear resistor which displays piezoresistivity. However, the variations in the electronic variables are more complex since three variables, rather than two, are involved: the carrier mobility, the concentration of active donors or acceptors, and the saturated velocity. For low current devices, the carrier mobility and active carrier concentration are primarily responsible for the piezoresistive effects, whereas for the present velocity saturated structures, the piezoresistive effects depend primarily on variations in the active carrier concentration and the saturated velocity.

A cantilever beam structure having resistive strain gauge devices of this type formed thereon is shown generally at 10 in FIG. 1. The initial material from which the beam 10 was formed was a three inch diameter disc composed of a 0.018 inch (0.046 cm) thick substrate 11 of sapphire (crystalline $Al_2O_3$) with a 0.6 micron layer of silicon on the top surface 12 of the sapphire substrate. The sapphire serves as an insulating substrate, and equivalent structures may also be produced from wafers of silicon on spinel. Two strain sensitive devices are formed on top surface 12 of the substrate of the beam 10: a longitudinal device 13 aligned parallel to the length of the beam and a transverse device 14 aligned perpendicular to the beam. As shown in the plan view of FIG. 1, two strips of aluminum conducting leads 15 electrically connect the longitudinal device 13 to pads 16 for connection with an external circuit while two strips of conducting leads 17 connect the transverse device 14 to connection pads 18.

Figure 2:
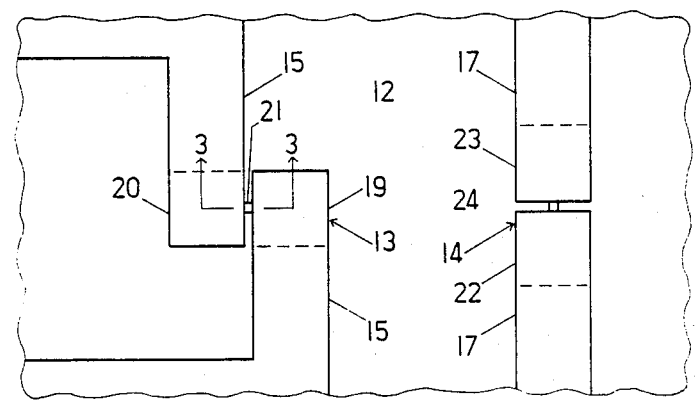
FIG. 2 is an expanded plan view of the cantilever beam of FIG. 1 showing the details of the construction of the longitudinal and transverse devices and the metalized contacts thereto.

The initial silicon on sapphire material consisted of a sapphire substrate with 1102 orientation and 750 ohm-cm conductivity silicon layer. The disc was cut into quarters, cleaned, and oxidized for two hours at 930° C. in dry oxygen with 8% hydrochloric acid. The silicon layer was blanket implanted at 150 KeV with a boron dose of $1 \times 10^{14}$ per square centimeter. The quarters were then annealed at 900° C. in dry nitrogen for two hours. A P− layer was formed in the silicon by applying a photoresist to the surface of the silicon layer, prebaking, aligning the device mask and irradiating and developing the photoresist, post-baking, etching the silicon dioxide layer, stripping the photoresist in the non-device areas and applying a silicon etchant to remove the silicon from all areas of the wafer quarters except at those areas at which the devices 13 and 14 lie. The resulting silicon structures are best shown in the expanded plan view of FIG. 2. The longitudinal device 13 includes expanded, P type, terminal regions 19 and 20 which are spaced from each other and connected by a smaller channel region 21. Similarly, the device 14 includes relatively large terminal regions 22 and 23 separated from one another with a smaller channel region 24 extending between them. The spacing between the terminal regions (the length of the channel region) and the width of the channel region are selected so that a sufficient electric field will be developed in the channel region to cause velocity saturation to occur therein at reasonable voltage levels. The terminal regions are much larger and provide sufficient area for low resistance ohmic contact with the vapor deposited metal conductors (15 for the device 13 and 17 for the device 14) and are large enough to have a relatively small contribution to the total electrical resistance of the devices 13 and 14, with most of the resistance of the devices being concentrated in the channel region. For example, for the devices shown in FIG. 2, the terminal regions 19, 20, 22, and 23 may be squares 25 microns on a side, with the terminal regions 19 and 20 and the regions 22 and 23 being separated from one another by approximately 5 microns, defining the length of the channels 21 and 24. For the devices shown in FIG. 2, the widths of the channels 21 and 24 are also 5 microns.

After the silicon areas had been formed and isolated on the sapphire substrate base, the wafer quarters were cleaned and subjected to a second oxidation for two hours at 930° C. in dry oxygen with 8 percent hydrochloric acid, after which a contact mask outlining the metalized contact regions was applied, photoresist applied and developed, the areas of the photoresist overlaying the terminal regions 19, 20, 22 and 23 removed, and the silicon dioxide layer in these areas etched off. The terminal areas were then cleaned, metal vapor deposited, and the structure annealed for sixty minutes at 474° C. in nitrogen. A metal mask defining the conducting regions on the beams was mounted in place, a photoresist applied and developed, and the metal etched away in the non-conduction areas to leave the conducting leads 15 and 17. The wafer quarters were then cut into beams of 1.4 inch (3.556 cm) by 0.2 inch (0.508 cm) dimensions with the devices 13 and 14 at the center of each beam.

Figure 3:
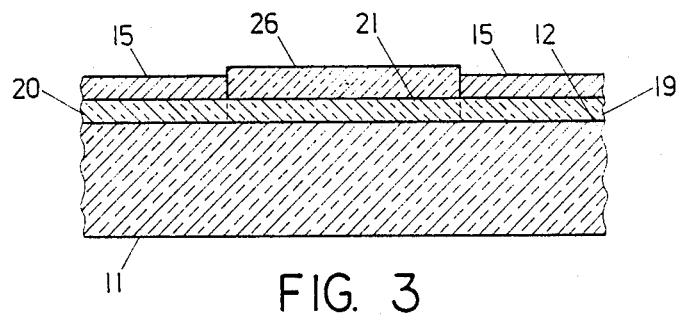
FIG. 3 is a cross-sectional view of the longitudinal device of FIG. 2.

Surface and bulk measurements performed on the silicon in the terminal regions 19, 20, 22 and 23 and in the channel regions 21 and 24 indicate an electrically active boron concentration near $1 \times 10^{18}$ per cubic centimeter, a low minority carrier lifetime and a small oxide layer over the channels 21 and 24. As illustrated in the cross-sectional view of a portion of the device 13 in FIG. 3, the device is isolated on the surface 12 insulating sapphire substrate 11, with the aluminum conducting strips 15 in ohmic contact with the terminal regions 19 and 20 and with the channel region 21 connecting them overlaid by a silicon dioxide layer 26. The silicon layer is grown on the underlying sapphire substrate 11 and in intimate contact with it so that deformations of the substrate will cause corresponding deformations in the silicon channel 21. Because the channel 21 is mounted on the surface of the insulating sapphire substrate, and is isolated and passivated by the oxide layer 26, conduction between the terminal regions 19 and 20 can take place only through the channel region 21, with charge flow within the channel region being substantially uniformly distributed through its cross-section with a DC or a relatively slowly time varying potential applied to the terminal regions and thus across the channel region. A similar cross-sectional construction is observed in the transverse device 14.

Figure 4:
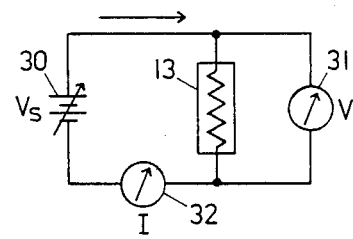
FIG. 4 is a schematic diagram of a test circuit for the devices of FIG. 2.

The devices 13 and 14 were tested for strain sensitivity by firmly clamping one end of the beam 10 and connecting thin conducting wires from the attachment pads 16 and 18 which could be connected to a voltage source. A schematic test circuit having a variable voltage source 30, with an associated voltmeter 31 and ammeter 32, is shown in FIG. 4. A micrometer head was used to apply a known deflection to the end of the beam opposite to that at which the beam was clamped. The strain S in a cantilever beam of length L and thickness t which is deflected from the horizontal at its end by a distance d can be approximately determined by the following expression:

$$S = td/L^2$$

Figure 5:
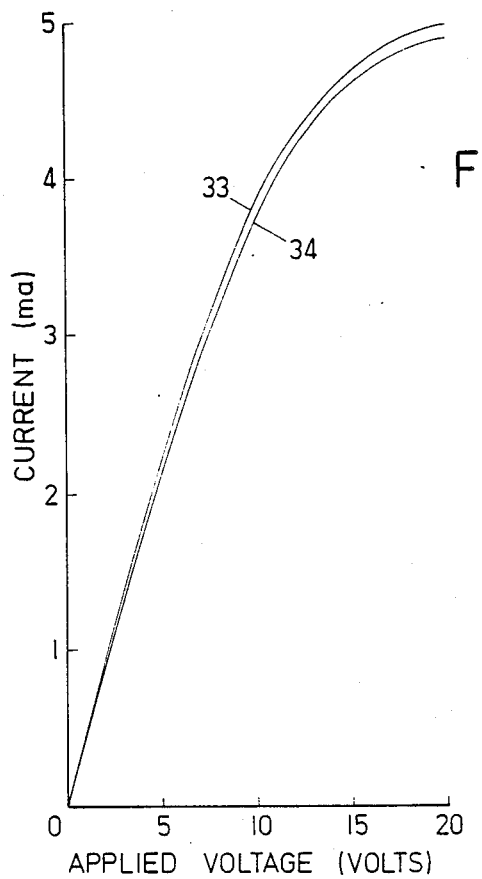
FIG. 5 is an illustrative graph showing the V-I characteristics of the longitudinal device of FIG. 2 under unstrained and strained conditions.
Figure 6:
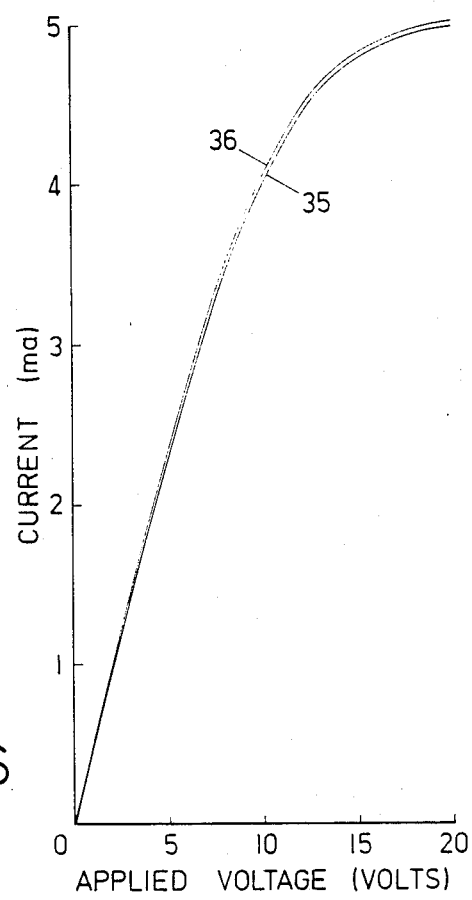
FIG. 6 is an illustrative graph showing the V-I characteristics of the transverse device of FIG. 2 under unstrained and strained conditions.

The graph of FIG. 5 shows the V-I characteristics of the longitudinal device 12 at room temperature (27° C.) for unstrained conditions (curve 33) and under conditions of 0.036% strain (curve 34). Similarly, FIG. 6 shows the V-I characteristics of the transverse device under unstrained conditions (curve 35) and under 0.036% strain (curve 36). It is observed from these graphs that, although there is a change in resistance with strain in the linear portions of the V-I curves, the separation between the strained and unstrained curves is much greater in the non-linear portions of these curves as the velocity of the carriers begins to saturate. It is also observed, not surprisingly, that a greater change in the V-I characteristics occurs in the longitudinally aligned device, in which current is conducted in the same direction as that in which the strain is imposed, than in the transverse device, wherein current flows in a direction transverse to the direction at which the strain is applied.

For normal piezoresistive devices in which the devices are biased to operate in their linear range, a strain imposed upon the device is accompanied by an increase or decrease in the linear resistance of the device. The gauge factor, which measures the sensitivity of the piezoresistive devices to strain changes, is conventionally defined as the strained resistance over the unstrained resistance divided by the amount of strain. Since both the strained and unstrained resistances are linear, the gauge factor is essentially constant—that is, independent of the applied voltage or the current through the device. For the present velocity saturated devices, the gauge factor cannot be so simply defined since the voltage and current in the device bear a non-linear relationship. Gauge factors for the present non-linear devices can be defined at specific voltage or current levels; i.e., a gauge factor can be defined to quantify the effect of a change in strain with either a constant applied voltage across the device or a constant current through the device. The large signal, constant voltage gauge factor may be defined as:

$$F\bigg|_v = \frac{\Delta I/I}{S}$$

where V is the constant voltage level, I is the current level before strain is applied, $\Delta I$ is the change in current with applied strain, and S is the strain applied to the material. Similarly, a constant current gauge factor can be defined as:

$$F\bigg|_I = \frac{\Delta V/V}{S}$$

where I is the constant current level, V is the initial voltage across the device, and $\Delta V$ is the change in voltage with the applied strain S.

If the device is provided with DC bias which places it in the non-linear range of operation, the effective resistance seen by a small, superimposed AC signal will vary with the applied strain. The instantaneous or small signal resistance is the tangent to the V-I curve at a particular voltage or current value. A small signal constant voltage gauge factor can be defined as:

$$f\bigg|_v = \frac{(r_s - r_o)/r_o}{S}$$

where $r_o$ is the unstrained small signal resistance at the voltage level V, $r_s$ is the strained small signal resistance at the voltage V, and S is the strain.

Similarly, a small signal, constant current gauge factor can be defined as:

$$f\bigg|_I = \frac{(r_s' - r_o)/r_o}{S}$$

where $r_s'$ is the strained small signal resistance at the constant current I, $r_o$ is the unstrained small signal resistance, and S is the strain.

Figure 7:
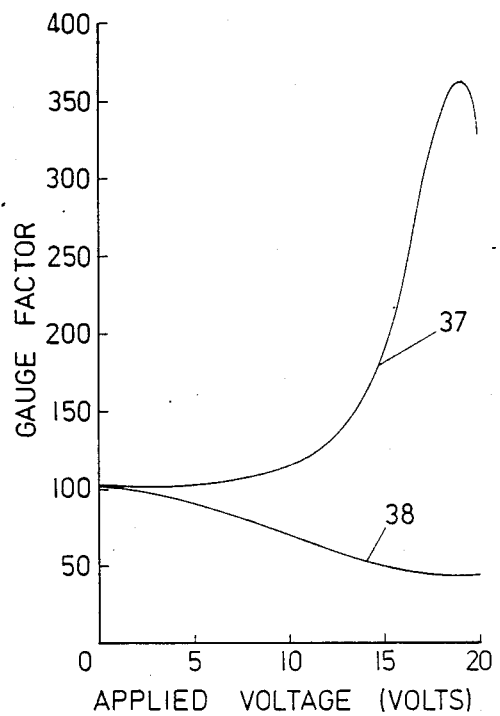
FIG. 7 is an illustrative graph showing the constant current and the constant voltage gauge factors of the longitudinal device as a function of operating voltage.
Figure 8:
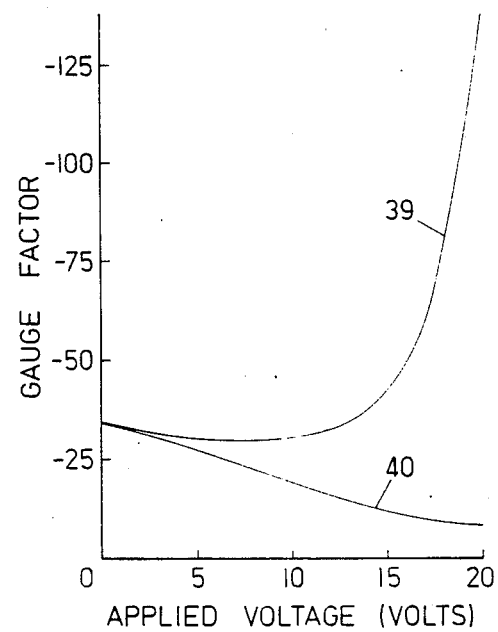
FIG. 8 is an illustrative graph showing the constant current and constant voltage gauge factors of the transverse device as a function of operating voltage.

The large signal gauge factors for the longitudinal device 13 as a function of applied voltage are shown in FIG. 7. The curve labeled 37 is the constant current gauge factor and the curve labeled 38 is the constant voltage gauge factor. The large signal gauge factors as a function of applied voltage for the transverse device 14 are shown in FIG. 8. The curve 39 is the constant current gauge factor and the curve 40 is the constant voltage gauge factor. It is seen that for low applied voltages, the gauge factors are substantially similar to those observed in normal piezoresistive devices, but the constant current large signal gauge factors increase dramatically as the device approaches and enters velocity saturation. The constant voltage gauge factors decline, as is expected, since the slope of the V-I curves decrease at higher voltages.

Figure 9:
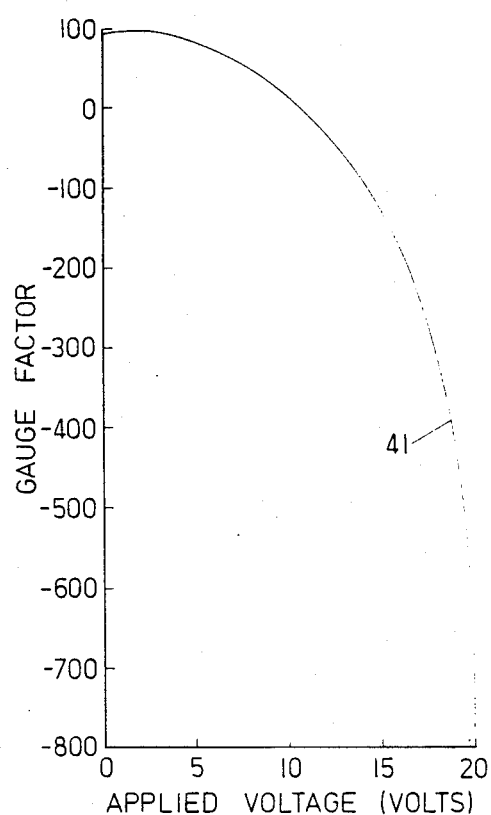
FIG. 9 is an illustrative graph showing the small signal gauge factor for the longitudinal device as a function of operating voltage.

The constant voltage small signal gauge factor for the longitudinal device as a function of applied voltage is shown in the curve labeled 41 in FIG. 9. A similar, though inverted curve is obtained for the transverse device. Again, it is noted that the effective small signal gauge factor is similar to gauge factors observed in normal piezoresistive devices at small bias voltages but rapidly changes to very large effective gauge factors at higher applied voltages as the device approaches and enters velocity saturation.

Figure 10:
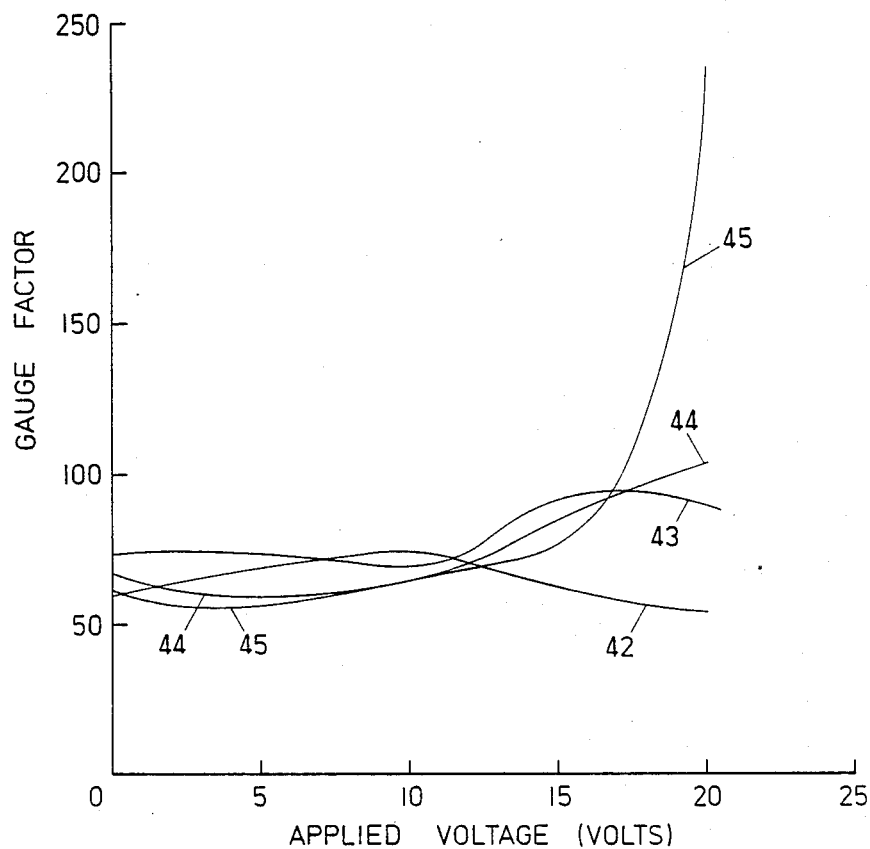
FIG. 10 is an illustrative graph showing the constant current gauge factors as a function of operating voltage for devices of varying doping levels.

To illustrate the effect of the doping levels within the conducting channel region, four cantilever beams were formed with resistor structures substantially identical to those described above and shown in FIGS. 1 and 2. The process conditions for forming each of the beams and devices were identical for each beam with the exception that the devices on the beams were implanted at one of four levels: $4\times10^{13}$; $6\times10^{13}$; $8\times10^{13}$; and $1\times10^{14}$ boron atoms per square centimeter. The large signal, constant current gauge factors as a function of applied voltage for longitudinally aligned devices on these four beams with 0.036% strain are shown in FIG. 10. Curve 42 is the gauge factor for an implantation level of $4\times10^{13}$ which, after annealing, corresponds to a boron impurity concentration of $6.67\times10^{17}$ boron atoms per cubic centimeter. Curve 43 is the gauge factor for an implantation level of $6\times10^{13}$ ($1.0\times10^{18}/cm^3$). Curve 44 is the gauge factor for an implantation level of $8\times10^{13}$ ($1.33\times10^{18}/cm^3$). Curve 45 is the gauge factor for an implantation level of $1\times10^{14}$ ($1.67\times10^{18}/cm^3$). It is seen that at the three lower implantation levels the gauge factors vary somewhat with applied voltage but are roughly constant and do not exhibit a dramatic increase, indicating that velocity saturation effects are not significant. For the highest of the doping levels, a very substantial and dramatic increase is seen as the applied voltage level approaches 20 volts, indicating that the device is approaching and entering velocity saturation at these voltage levels, with a concurrent rapid and dramatic increase in the gauge factor.

Figure 11:
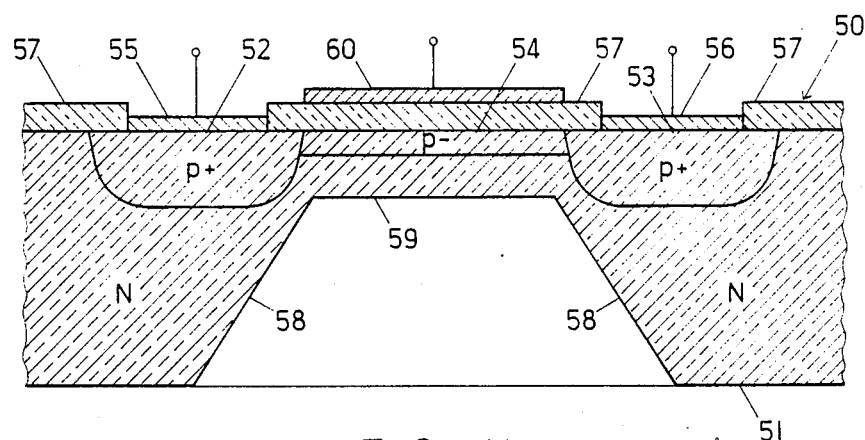
FIG. 11 is a cross-sectional view of a device in accordance with the invention formed in a silicon substrate as an MOS field effect transistor.

The above-described strain sensitivity observed in velocity saturated structures is not confined to silicon on sapphire, but may also be incorporated in other silicon conducting systems where the conducting channel is sufficiently isolated from the substrate to enable velocity saturation conditions to occur. An example of such a structure incorporated in a MOS type field effect transistor is shown generally at 50 in FIG. 11. The device 50 is formed in a substrate 51 of single crystal silicon which may have a uniform doping of one conductivity type (N type shown). A source region 52 and a drain region 53 of opposite conductivity type (P type shown) are formed at spaced positions in the substrate. A conducting channel 54 extends between the source and drain and is suitably sized in width, depth, and length, and properly doped with the same conductivity type impurity as the source and drain so as to allow velocity saturation to occur. A vapor deposited metal contact 55 is formed over the source region 52 and a similar metal contact 56 is formed over the drain region 53, while the remainder of the surface is covered by a silicon dioxide layer 57. A cavity defined by walls 58 may be formed in the opposite side of the substrate 51 from the channel 54 by standard preferential etching techniques to leave a thin layer or membrane of silicon at the bottom 59 of the cavity so that the layer of silicon containing the conducting channel 54 may be subject to stresses—for example, as imposed by pressure across the membrane. The strain induced in the channel 54 when it is deformed can be detected by the changes in the V-I characteristics between the source and drain in a manner similar to that described above for the devices 13 and 14.

A metalized gate electrode 60 may also be formed on the silicon dioxide layer 57 above the conducting channel 54 in accordance with standard MOS technology. The device may be operated in the depletion mode by applying a voltage to the gate 60 to restrict the current flow through the channel 54 while the channel is maintained at or near velocity saturation conditions.

It is understood that the invention is not confined to the particular constructions and methods described herein, but embraces such modified forms thereof as come within the scope of the following claims.

What is claimed is:

1. Apparatus for measuring strain comprising:
   (a) a substrate of insulating material which can be deformed to strain the substrate and having a top surface;
   (b) a layer of crystalline silicon formed on the top surface of the substrate;
   (c) a pair of terminal regions formed in the silicon layer and spaced from one another and having an impurity of a chosen conductivity type dispersed therein, and a channel region formed in the silicon layer having an impurity therein of the same conductivity type as the terminal regions and extending between them, the length, width, and depth of, and concentration of impurity in the channel region selected such that charge carriers in the entire channel region will reach velocity saturation at potentials applied to the terminal regions which are lower than the breakdown of the channel region and with charge flow within the channel region being substantially uniformly distributed through its cross section;
   (d) means for applying a potential across the terminal regions sufficient to cause the charge carriers in the channel region to be in velocity saturation such that the voltage-current characteristic of the channel region is non-linear; and
   (e) means for measuring changes in the voltage-current characteristics of the channel region as the substrate is deformed and thereby strain is induced in the channel region.

2. The apparatus of claim 1 wherein the means for applying potential across the terminal regions applies a substantially constant voltage thereto which is independent of the current flowing between the terminal regions.

3. The apparatus of claim 1 wherein the means for applying potential across the terminal regions provides a substantially constant current between the terminal regions which is substantially independent of the voltage across the terminal regions.

4. The apparatus of claim 1 wherein the channel region is approximately 5 microns in length and 5 microns in width, less than 1 micron in depth and is uniformly doped with the impurity.

5. The apparatus of claim 1 wherein the impurity channel region is selected from donor and acceptor impurities at a concentration between about $1.0 \times 10^{18}$ and $10^{19}$ atoms per cubic centimeter.

6. The apparatus of claim 1 including metal conducting leads bonded to the terminal regions.

7. The apparatus of claim 1 wherein the substrate is crystalline sapphire.

8. The apparatus of claim 1 wherein the substrate is crystalline sapphire, the channel is approximately 5 microns in length, 5 microns in width, less than 1 micron in depth, and is uniformly doped with boron at an active concentration of approximately $1.7 \times 10^{18}$ atoms per cubic centimeter.

9. Apparatus for measuring strain comprising:
   (a) a substrate of crystalline silicon which can be deformed to strain the substrate and having an impurity dispersed therein of a first conductivity type;
   (b) a pair of terminal regions formed in the substrate having an impurity therein of a conductivity type opposite to that of the substrate, the terminal regions spaced a selected distance from one another;
   (c) a channel region formed in the substrate having an impurity therein of the same conductivity type as the terminal regions and extending between them, the length, width, and depth of, and concentration of impurity in the channel region selected such that charge carriers in the entire channel region will reach velocity saturation at potentials applied to the terminal regions which are lower than the breakdown potential of the channel region and with charge flow within the channel region being substantially uniformly distributed through its cross section;
   (d) means for applying a potential across the terminal regions sufficient to cause the charge carriers in the channel region to be in velocity saturation such that the voltage-current characteristic of the channel region is non-linear; and
   (e) means for measuring changes in the voltage-current characteristics of the channel region as the substrate is deformed and thereby strain is induced in the channel region.

10. The apparatus of claim 9 wherein the means for applying potential across the terminal region applies a substantially constant voltage thereto which is independent of the current flowing between the terminal regions.

11. The apparatus of claim 9 wherein the means for applying potential across the terminal regions provides a substantially constant current between the terminal regions which is substantially independent of the voltage across the terminal regions.

12. The apparatus of claim 9 including an insulating layer of silicon dioxide formed over the surface of the channel region and an electrically conductive gate electrode formed on the insulating layer over the channel region.

13. The device of claim 9 wherein the impurity in the channel region is selected from donor and acceptor impurities at a concentration between about $1.0 \times 10^{18}$ and $1.0 \times 10^{19}$ atoms per cubic centimeter.

14. The device of claim 9 including metal conducting leads bonded to the terminal regions.

15. A method of measuring the strain in a structural member comprising the steps of:
   (a) affixing to the structural member a strain gauge device such that the device is strained with the structural member, the device comprising:
      (1) a substrate of insulating material which can be deformed to strain the substrate and having a top surface,
      (2) a layer of crystalline silicon formed on the top surface of the substrate,
      (3) a pair of terminal regions formed in the silicon layer and spaced from one another and having an impurity of a chosen conductivity type dispersed therein, and a channel region formed in the silicon layer having an impurity therein of the same conductivity type as the terminal regions and extending between them, the length, width, and depth of, and concentration of impurity in the channel region selected such that charge carriers in the entire channel region will reach velocity saturation at potentials applied to the terminal regions which are lower than the breakdown potential of the channel region and will charge flow within the channel region being substantially uniformly distributed through its cross section;

(b) applying a potential across the terminal regions of the strain gauge device sufficient to cause the charge carriers in the channel region to be in velocity saturation such that the voltage-current characteristic of the channel region is non-linear;

(c) measuring the voltage-current characteristics of the channel region between the terminal regions;

(d) straining the structural member and thereby the strain gauge device;

(e) measuring the voltage-current characteristics of the strain gauge device as the structural member is strained to determine the change in the voltage-current characteristics as a result of the strain.

16. The method of claim 15 wherein the step of applying a potential across the terminal regions comprises applying a substantially constant voltage thereto which is independent of the current flowing between the terminal regions.

17. The method of claim 15 wherein the step of applying a potential across the terminal regions comprises providing a substantially constant current between the terminal regions which is substantially independent of the voltage across the terminal regions.

18. The method of claim 15 wherein the channel region of the strain gauge device is approximately 5 microns in length and 5 microns in width, less than 1 micron in depth and is uniformly doped with the impurity.

19. The method of claim 15 wherein the impurity in the channel region of the strain gauge device is selected from donor and acceptor impurities at a concentration between about $1.0 \times 10^{18}$ and $1.0 \times 10^{19}$ atoms per cubic centimeter.

20. The method of claim 18 wherein the impurity in the terminal and channel regions is selected from the group consisting of boron and phosphorous.

21. The method of claim 15 wherein the substrate of insulating material is crystalline sapphire.

22. The method of claim 15 wherein the substrate of insulating material is crystalline sapphire, the channel is approximately 5 microns in length, 5 microns in width, less than 1 micron in depth, and is uniformly doped with boron at an active concentration of approximately $1.7 \times 10^{18}$ atoms per cubic centimeter.

23. A method of measuring the strain in a structural member comprising the steps of:

(a) affixing to the structural member a strain gauge device such that the device is strained with the structural member, the device comprising:

(1) a substrate of crystalline silicon which can be deformed to strain the substrate and having an impurity dispersed therein of a first conductivity type, (2) a pair of terminal regions formed in the substrate having an impurity therein of a conductivity type opposite to that of the substrate, the terminal regions spaced a selected distance from one another, and (3) a channel region formed in the substrate having an impurity of the same conductivity type as the terminal regions and extending between them, the length, width, and depth of, and concentration of impurity in the channel region selected such that the charge carriers in the entire channel region will reach velocity saturation at potentials applied to the terminal regions which are lower than the breakdown potential of the channel region and with charge flow within the channel region being substantially uniformly distributed through its cross section;

(b) applying a potential across the terminal regions of the strain gauge device sufficient to cause the charge carriers in the channel region to substantially reach velocity saturation such that the voltage-current characteristic of the channel region is non-linear;

(c) measuring the voltage-current characteristics of the channel region between the terminal regions;

(d) straining the structural member and thereby the strain gauge device;

(e) measuring the voltage-current characteristics of the strain gauge device as the structural member is strained to determine the change in the voltage-current characteristics as a result of the strain.

24. The method of claim 23 wherein the step of applying a potential across the terminal regions comprises applying a substantially constant voltage thereto which is independent of the current flowing between the terminal regions.

25. The method of claim 23 wherein the step of applying a potential across the terminal regions comprises providing a substantially constant current between the terminal regions which is substantially independent of the voltage across the terminal regions.

26. The method of claim 23 including an insulating layer of silicon dioxide formed over the surface of the channel region of the strain gauge device and an electrically conductive gate electrode formed on the insulating layer over the channel region.

27. The method of claim 23 wherein the impurity in the channel region of the strain gauge device is selected from donor and acceptor impurities at a concentration between about $1.0 \times 10^{18}$ and $1.0 \times 10^{19}$ atoms per cubic centimeter.

28. The method of claim 27 wherein the impurity in the terminal and channel regions is selected from the group consisting of boron and phosphorous.

* * * * *